US008367544B2

(12) United States Patent
Cheng et al.

(10) Patent No.: US 8,367,544 B2
(45) Date of Patent: Feb. 5, 2013

(54) SELF-ALIGNED PATTERNED ETCH STOP LAYERS FOR SEMICONDUCTOR DEVICES

(75) Inventors: Kangguo Cheng, Albany, NY (US); Lawrence A. Clevenger, Hopewell Junction, NY (US); Johnathan E. Faltermeier, Albany, NY (US); Stephan Grunow, Hopewell Junction, NY (US); Kaushik A. Kumar, Hopewell Junction, NY (US); Kevin S. Petrarca, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 482 days.

(21) Appl. No.: 12/582,137

(22) Filed: Oct. 20, 2009

(65) Prior Publication Data

US 2011/0092069 A1   Apr. 21, 2011

(51) Int. Cl.
*H01L 21/44* (2006.01)
(52) U.S. Cl. ......................................... 438/672; 438/669
(58) Field of Classification Search .................. 438/672, 438/669; 257/E21.587, E21.294
See application file for complete search history.

(56) References Cited

U.S. PATENT DOCUMENTS

| 6,025,273 A | 2/2000 | Chen et al. |
| 6,827,869 B2 | 12/2004 | Podlesnik et al. |
| 2002/0185469 A1 | 12/2002 | Podlesnik et al. |
| 2008/0026487 A1 * | 1/2008 | Feustel et al. ..................... 438/7 |

FOREIGN PATENT DOCUMENTS

EP   1077475 A2   2/2001

* cited by examiner

*Primary Examiner* — Fernando L Toledo
*Assistant Examiner* — Neil Prasad
(74) *Attorney, Agent, or Firm* — Cantor Colburn LLP; Parashos Kalaitzis (57) ABSTRACT

A method of forming a semiconductor device includes patterning a photoresist layer formed over a homogeneous semiconductor device layer to be etched; subjecting the semiconductor device to an implant process that selectively implants a sacrificial etch stop layer that is self-aligned in accordance with locations of features to be etched within the homogeneous semiconductor device layer, and at a desired depth for the features to be etched; etching a feature pattern defined by the patterned photoresist layer into the homogenous semiconductor device layer, stopping on the implanted sacrificial etch stop layer; and removing remaining portion of the implanted sacrificial etch stop layer prior to filling the etched feature pattern with a fill material.

11 Claims, 10 Drawing Sheets

SELF-ALIGNED PATTERNED ETCH STOP LAYERS FOR SEMICONDUCTOR DEVICES

BACKGROUND

The present invention relates generally to semiconductor device manufacturing techniques and, more particularly, to self-aligned patterned etch stop layers for semiconductor devices.

Metallization patterns on integrated circuits may be formed by depositing a dielectric layer, patterning the dielectric layer by photolithography and reactive ion etching (RIE) to form a groove or trench, and depositing a metal layer that fills the trench in the dielectric layer. The metal layer typically not only fills the trenches but also covers the entire semiconductor wafer. Thereafter, the excess metal is removed using either chemical-mechanical polishing (CMP) or an etch back process so that only the metal in the trenches remains. This technique, also referred to as "damascene" processing in the art, thus forms inlaid conductors in the dielectric layer. Damascene processing (an additive process) avoids the problems associated with metal etching (a subtractive process), such as, for example, the lack of suitable dry-etch plasma chemistries, problems in dimension control, the formation of small gaps that are difficult to fill with the subsequent dielectric layer, and the entrapment of impurities in inter wiring spaces.

In a dual damascene process, a monolithic via/line structure is formed from the repeated patterning of a single thick dielectric layer, followed by metal filling and CMP. First, a relatively thick dielectric layer (e.g., oxide, low-K material) is deposited on a planar surface. The dielectric thickness may be slightly larger than the desired final thickness of the via and line, since a small amount of dielectric material is removed during CMP. Via recesses are formed in the dielectric layer using photolithography and RIE that either partially etches through the dielectric or traverses the dielectric and stops on the underlying metal to be contacted. The line recesses (trenches) can then be formed using a separate photolithography step and a timed etching step. In lieu of forming the via recesses first, the trenches may be formed first followed by via recess formation.

In either instance, the via/line metallization is then deposited, and thereafter planarized using CMP. The resulting interconnects are produced with fewer process steps than with conventional single damascene processing. Moreover, with a dual damascene process, two layers of metal are formed simultaneously (e.g., a wiring line and contact stud vias), thus avoiding an interface therebetween.

On the other hand, existing dual damascene integration schemes with a homogeneous dielectric material (i.e., without buried etch stop layers therein) generally suffer from through-pitch dependent RIE lag, and pattern density dependent trench depth control. One common method to reduce these effects is to utilize buried etch stops within the dielectric layer. However, such a solution involves materials that typically hurt the overall effective dielectric constant of the material due to the nature of the materials that are required for the process. Alternatively, the benefits of dual damascene processing may be surrendered by reverting to single damascene processing.

SUMMARY

In an exemplary embodiment, a method of forming a semiconductor device includes patterning a photoresist layer formed over a homogeneous semiconductor device layer to be etched; subjecting the semiconductor device to an implant process that selectively implants a sacrificial etch stop layer that is self-aligned in accordance with locations of features to be etched within the homogeneous semiconductor device layer, and at a desired depth for the features to be etched; etching a feature pattern defined by the patterned photoresist layer into the homogenous semiconductor device layer, stopping on the implanted sacrificial etch stop layer; and removing remaining portion of the implanted sacrificial etch stop layer prior to filling the etched feature pattern with a fill material.

In another embodiment, a method of forming a wiring layer for a semiconductor device includes patterning a photoresist layer formed over a homogeneous dielectric layer to be etched; subjecting the semiconductor device to an implant process that selectively implants a sacrificial etch stop layer that is self-aligned in accordance with locations of features to be etched within the dielectric layer, and at a desired depth for the features to be etched; etching a feature pattern defined by the patterned photoresist layer into the dielectric layer, stopping on the implanted sacrificial etch stop layer; and removing remaining portions of the implanted sacrificial etch stop layer prior to filling the etched feature pattern with a metal fill material.

In still another embodiment, a method of forming a dual damascene wiring layer for a semiconductor device includes forming a plurality of vias within a homogeneous dielectric layer; filling the vias with an organic planarizing layer, forming a barrier layer over the organic planarizing layer, and forming a photoresist layer over the barrier layer; patterning the photoresist layer in accordance with trench features to be etched within the dielectric layer; subjecting the semiconductor device to an implant process that selectively implants a sacrificial etch stop layer within the dielectric layer that is self-aligned in accordance with locations of the trench features to be etched within the dielectric layer, and at a desired depth for the trench features to be etched; transferring the patterned trench features through a portion of the organic planarizing layer and through a hardmask layer disposed on the dielectric layer; etching the patterned trench features transferred to the hardmask defined by the patterned photoresist layer into the dielectric layer, stopping on the implanted sacrificial etch stop layer; stripping remaining portions of the organic planarizing layer; extending the depth of the vias by completely etching though a cap layer below the dielectric layer, and completely removing remaining portions of the implanted sacrificial etch stop layer prior to filling the vias and trenches with a metal fill material.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is a method of forming self-aligned, patterned etch stop layers for semiconductor devices. By selectively implanting a sacrificial species, such as carbon or other appropriate species, for example, into a dielectric a dielectric layer, a reliable etch stop layer is formed in structures that demand a tight tolerance with respect to through-pitch dependent RIE lag. Moreover, the implanted sacrificial etch stop formation is implemented in a matter that leaves the effective dielectric constant of the dielectric layer unchanged.

Although the exemplary embodiments herein are presented in the context of back end of line (BEOL) processing (i.e., semiconductor wiring levels), it should also be appreciated that the principles are equally applicable to other regions, such as the front end of line (FEOL) where bulk substrates are etched. For example, in a bulk substrate device, the concepts herein may apply to shallow trench isolation (STI) etching where the depth of the STI trenches is difficult to control with respect to isolated and nested regions.

Referring generally to FIGS. 1(a) through 1(j), there is shown a series of cross sectional views of an exemplary method of utilizing sacrificial, self-aligned implanted etch stop layers in semiconductor device formation, in accordance with an embodiment of the invention. Beginning with FIG. 1(a), a semiconductor structure 100 is shown at a state of production corresponding to initial via definition in preparation of wiring formation to a lower level 102 of the semiconductor structure 100. Again, in the example illustrated, the implanted etch stop technique is demonstrated for the BEOL stage in semiconductor device of processing. As such, the lower level 102 may represent a semiconductor layer in the active device (e.g., transistor) region of the structure 100, a first metal level or subsequent metal levels. As is familiar to one skilled in the art, a cap layer 104 (e.g., nitride) is formed over the lower level 102, followed by a dielectric layer 106 of sufficient thickness for dual damascene processing.

Figure 1A:
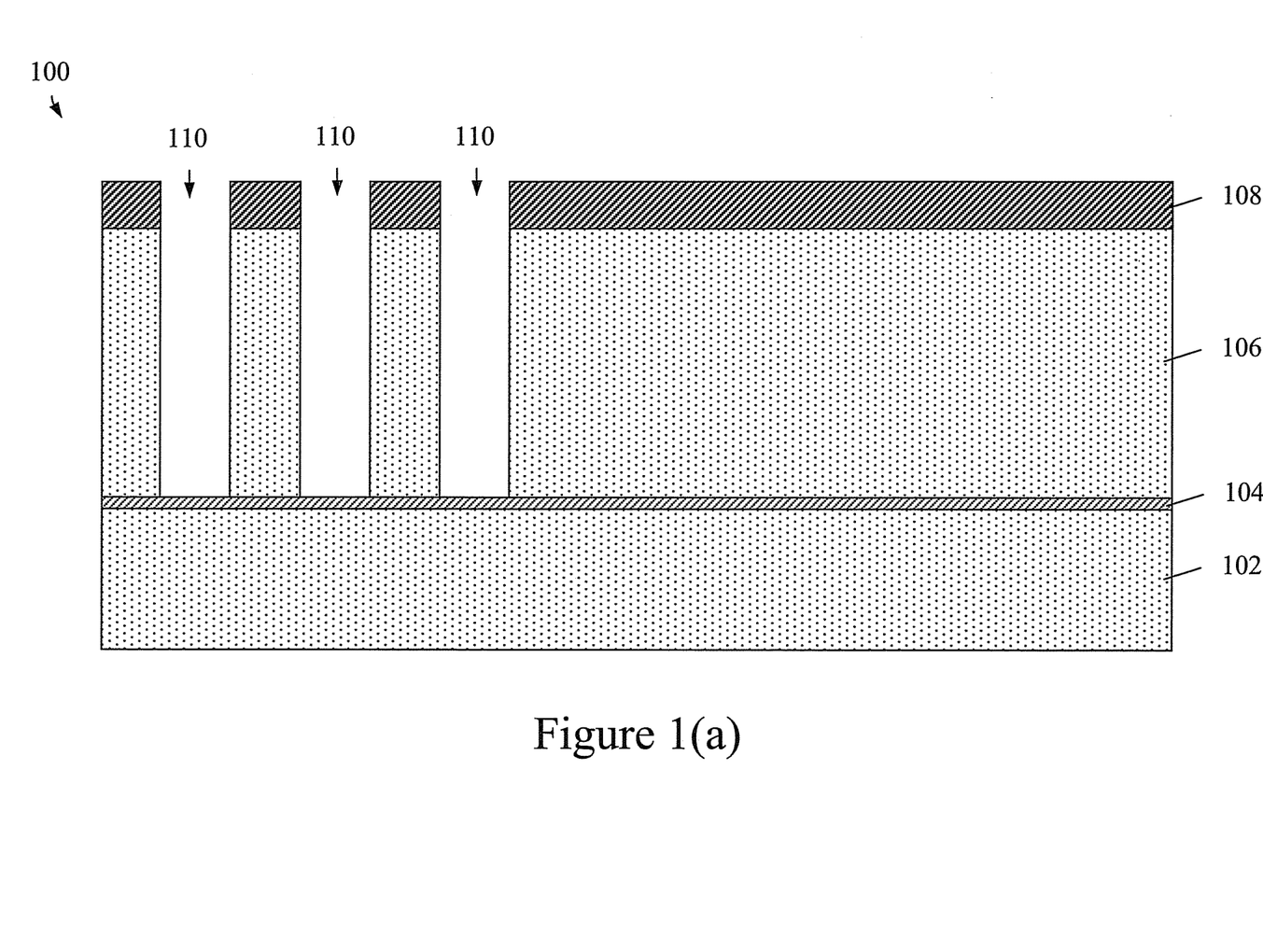
FIGS. 1(a) through 1(j) are a series of cross sectional views of an exemplary method of forming sacrificial, self-aligned patterned etch stop layers for semiconductor devices, in accordance with an embodiment of the invention.
Figure 1B:
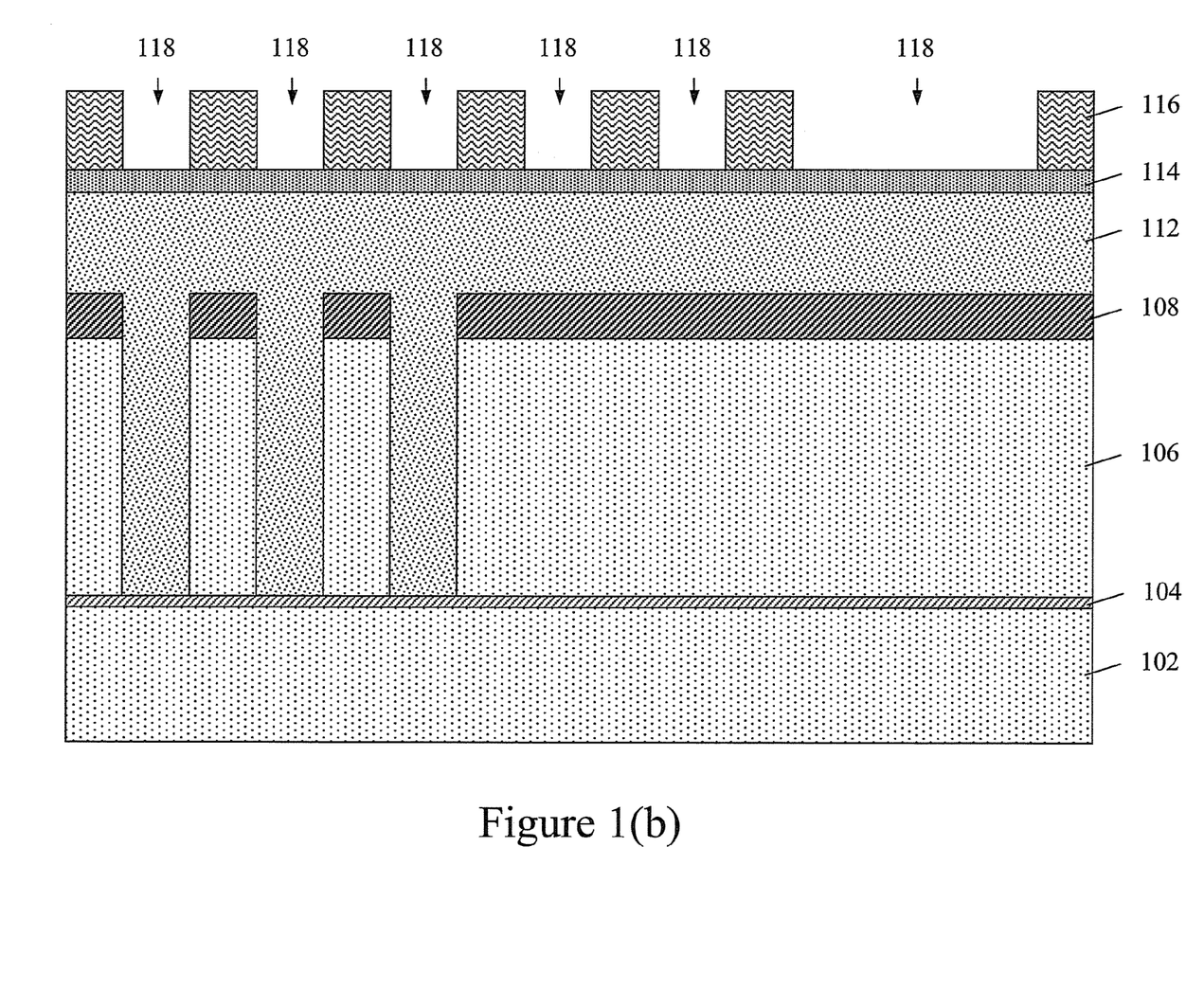

As indicated above, the present example depicts a "via first" dual damascene processing scheme, although a "trench first" scheme could also be used. FIG. 1(a) further depicts the completion of the via first etch process, where a patterned hardmask layer 108 is used to etch vias 110 completely through the dielectric layer 106, stopping on the cap layer 104. Then, as shown in FIG. 1(b), the vias are then overfilled with an organic planarizing layer (OPL) 112 as known in the art in order to form a planar surface in preparation of trench patterning of the dielectric layer 106. A barrier layer 114 (e.g., oxide, antireflective coating (ARC), etc.) is also formed over the OPL 112 in order to prevent resist contamination. FIG. 1(b) further illustrates a patterned photoresist layer 116 that defines the trench patterns 118 to be transferred to the dielectric layer 106.

Figure 1C:
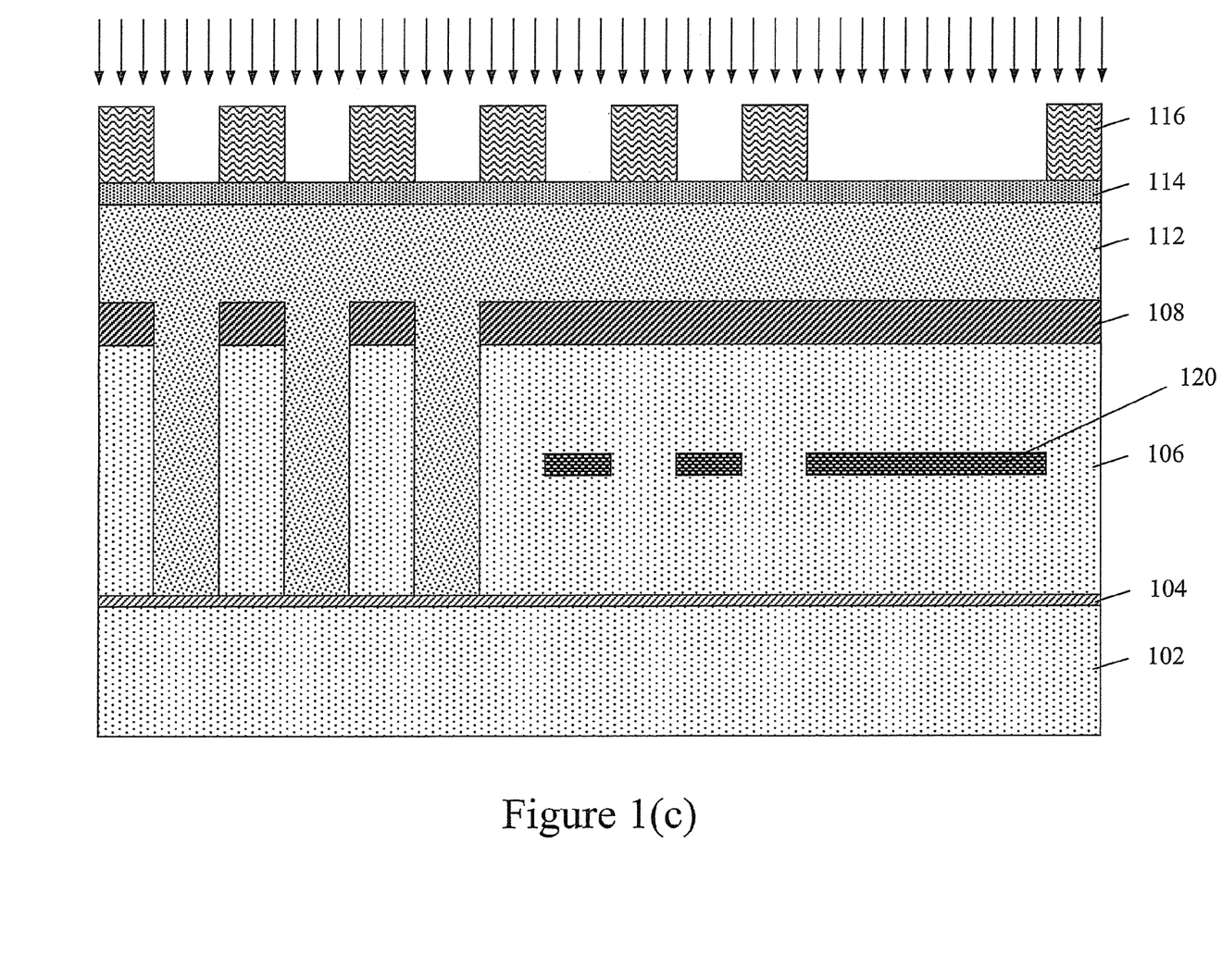

However, prior to transferring the trench patterns 118 into any of the layers below the resist layer 116, the structure is subjected to an etch stop species implant, as shown in FIG. 1(c). In an exemplary embodiment, the implanted etch stop species is carbon, with the implant process conditions designed to form resulting etch stop layers 120 at locations where trench etching is to be terminated. Notably, FIG. 1(c) does not depict implanted etch stop layer 120 at locations corresponding to OPL filled vias, as such material is organic. Moreover, any carbon atoms implanted into the OPL material may not form the same type of etch stop layer at the same depth as the layers 120 in the dielectric layer 106 and, in any event, the OPL 112 is also a sacrificial material itself.

Figure 1D:
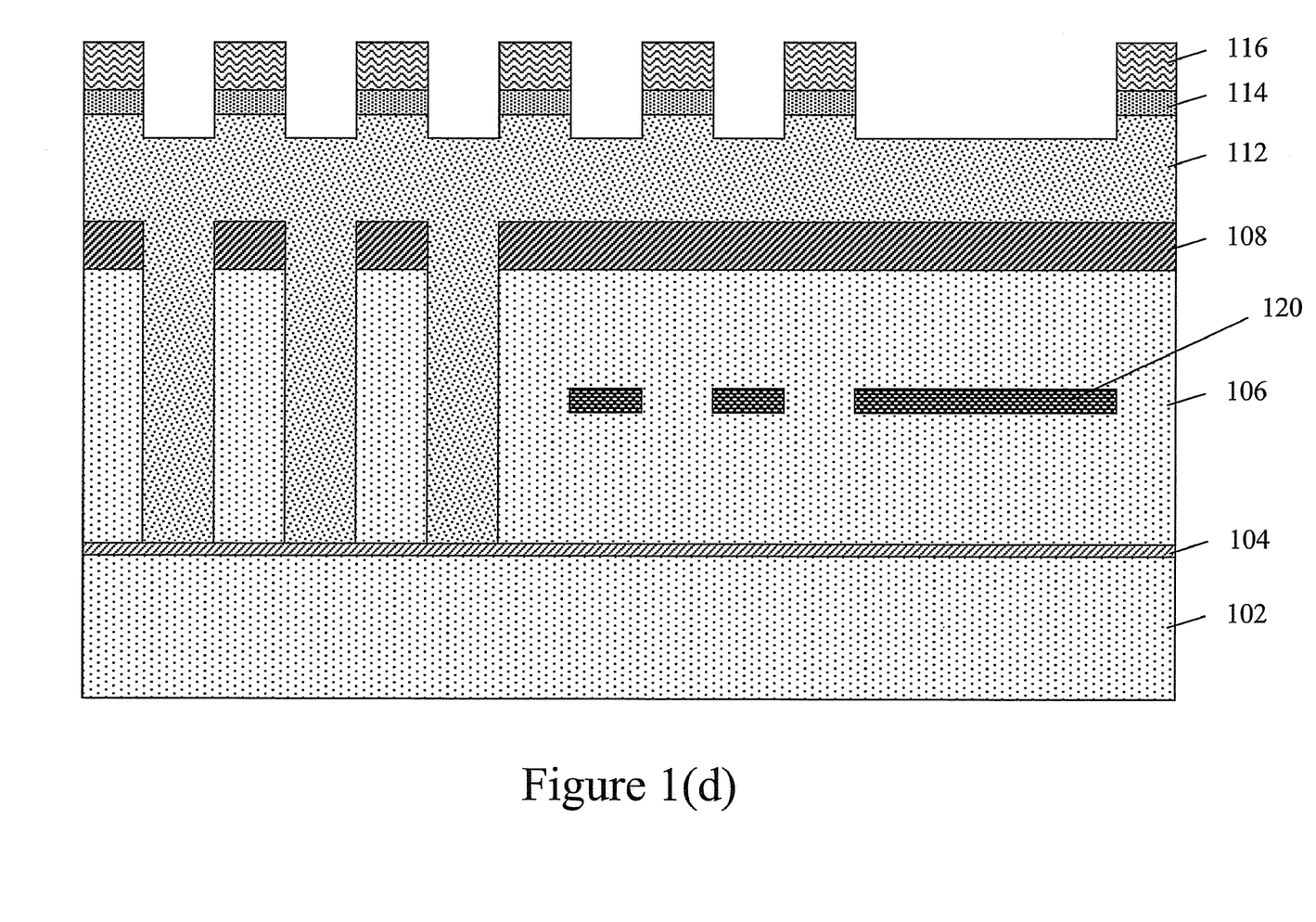
Figure 1E:
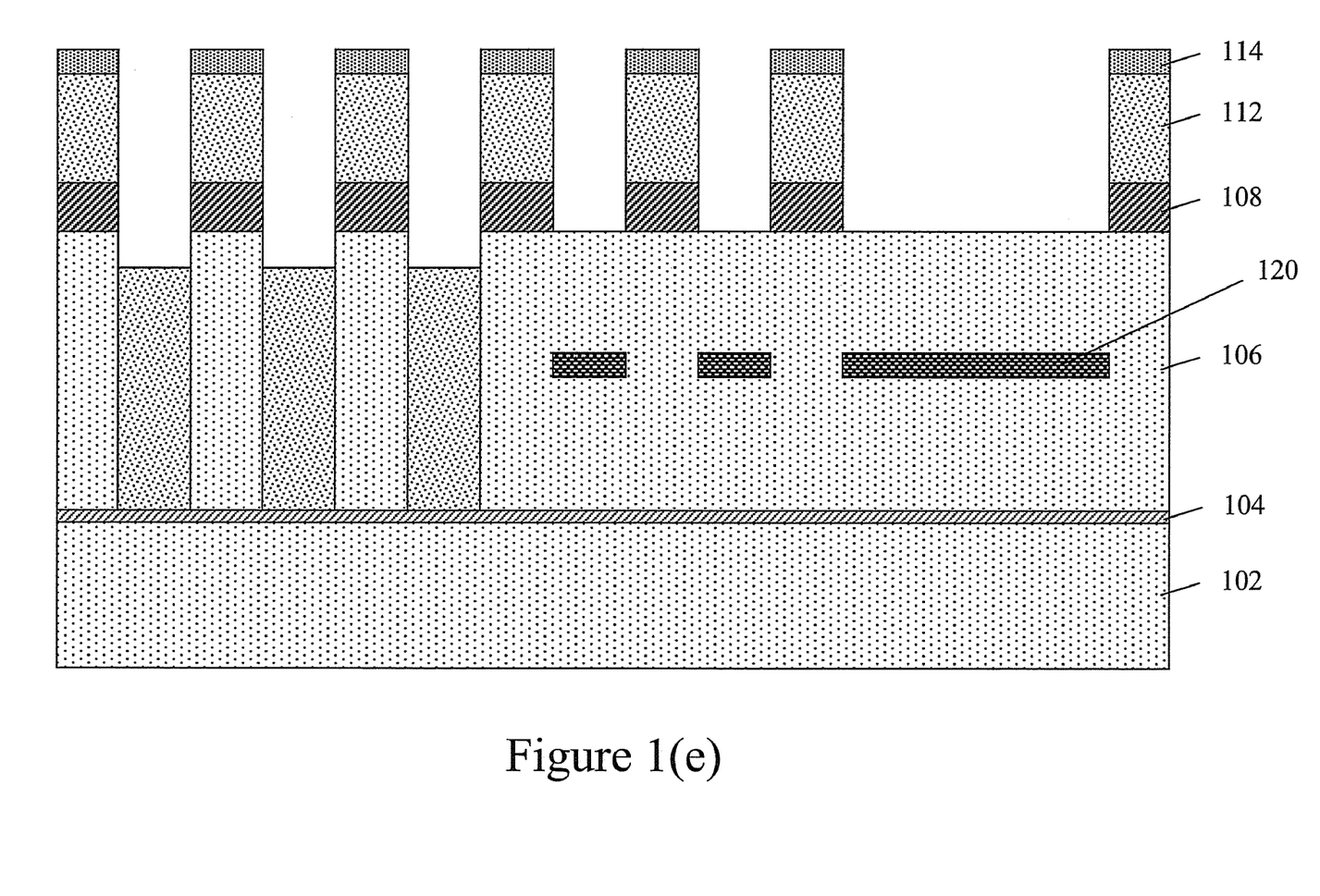

Once the sacrificial etch stop layer 120 is implanted, further dual damascene processing may continue as shown in FIG. 1(d), wherein the trench pattern defined in the resist layer 116 is transferred through the barrier layer 114 and partially in to the OPL 112. Notably, some of the resist material is consumed during this barrier etch process. Then, as shown in FIG. 1(e), the trench pattern is transferred through the horizontal portion of the OPL 112 and through the hardmask layer 108. In so doing, the resist layer may now be completely consumed and a portion of the OPL 112 within the vias also removed.

Figure 1F:
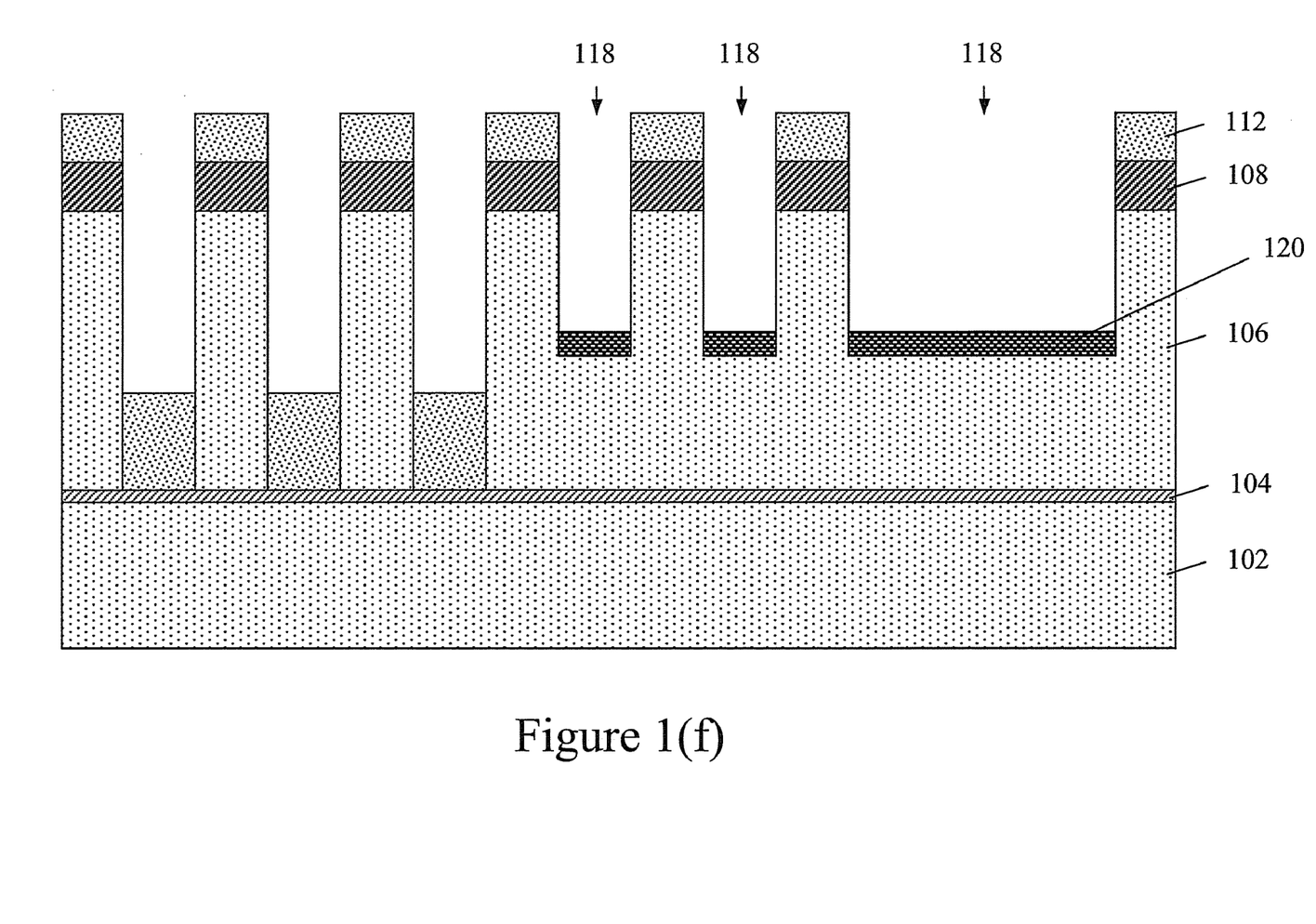
Figure 1G:
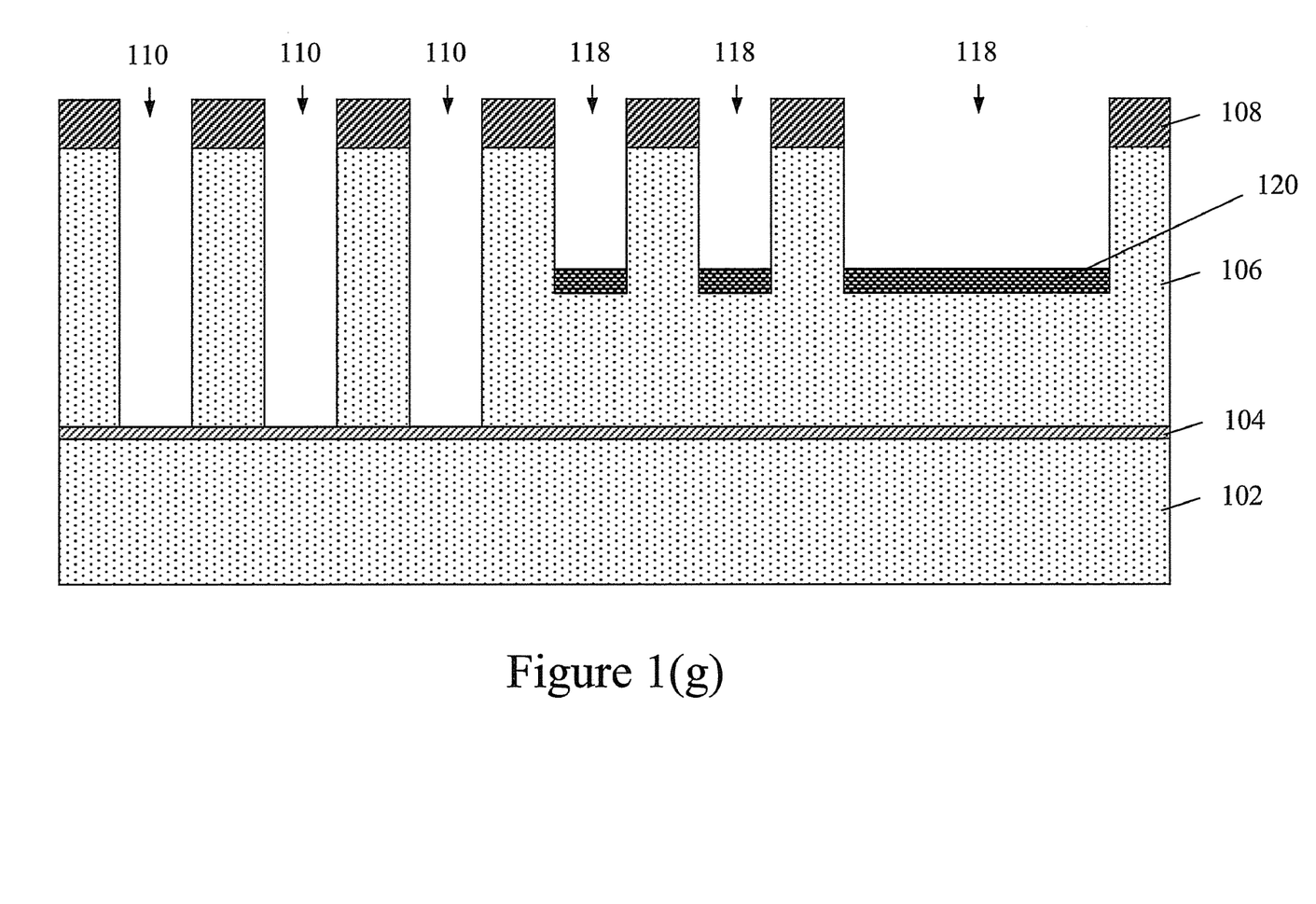

Proceeding to FIG. 1(f), the trench pattern is now etched into the dielectric layer 106, stopping on the implanted etch stop layer 120. During the trench etch, remaining portions of the barrier layer 114 are consumed, along with portions of the OPL layer. As opposed to using a homogenous dielectric layer, the sacrificial implanted etch stop layer 120 provides good trench etch depth control. Any remaining OPL material is then stripped away, as shown in FIG. 1(g). In embodiments where the sacrificial etch stop layer 120 comprises an organic material such as carbon, it is conceivable that some or all of the etch stop layer material may be consumed during the OPL strip. It is also conceivable that some or all of the etch stop layer material may become crusted or densified during the OPL strip. For purposes of illustration, the etch stop layer 120 is shown as remaining following the OPL strip of FIG. 1(g).

Figure 1H:
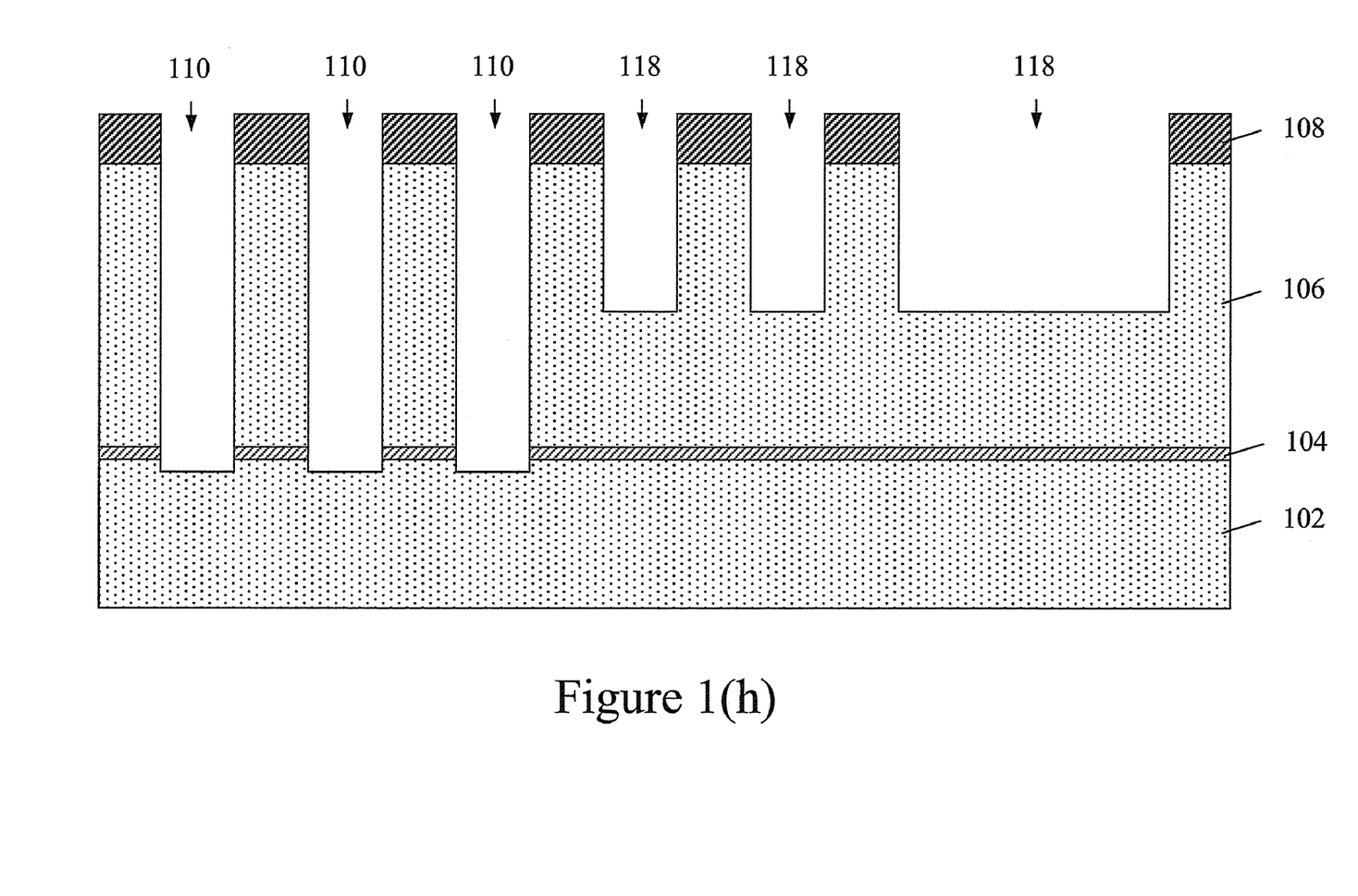
Figure 1I:
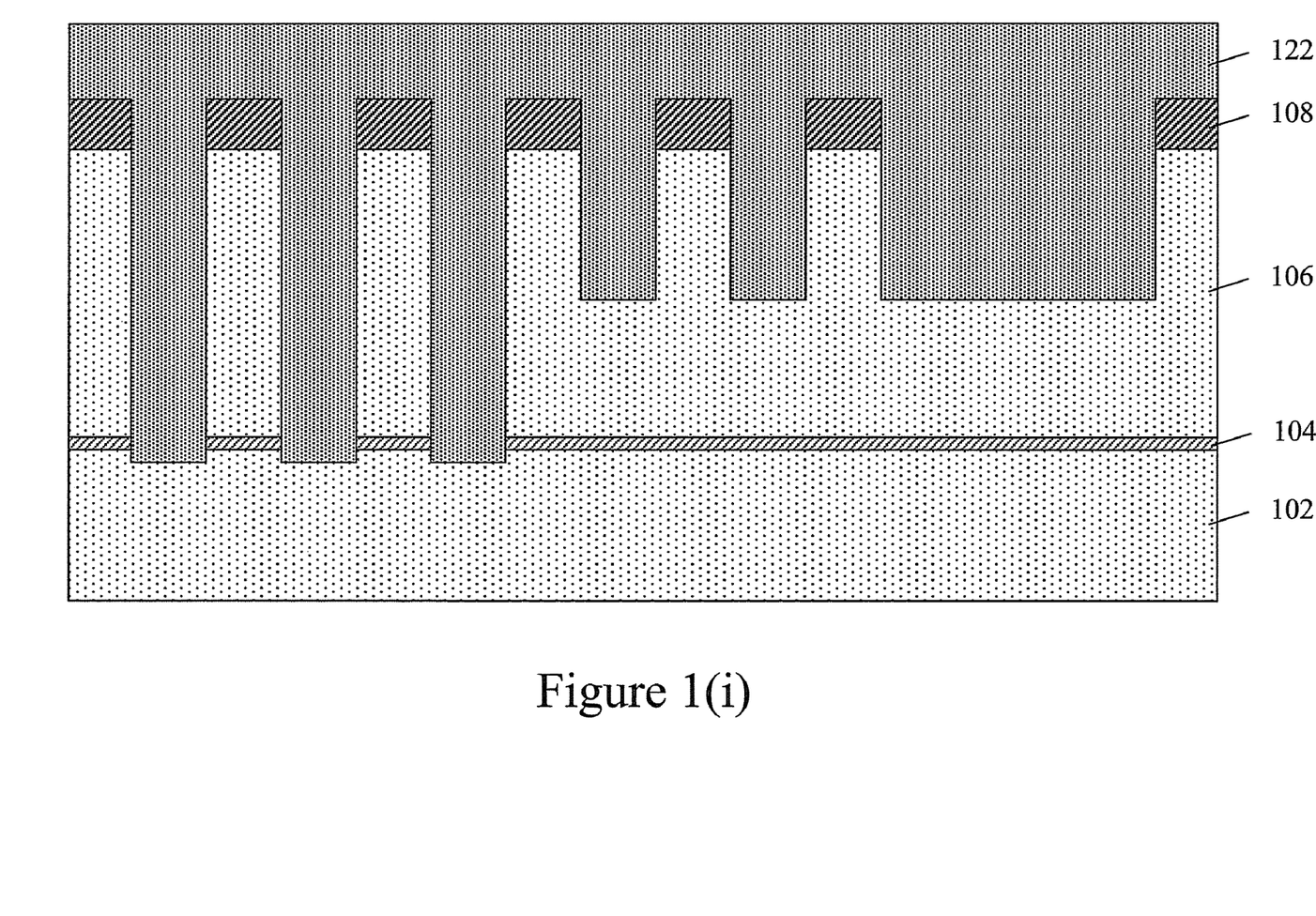
Figure 1J:
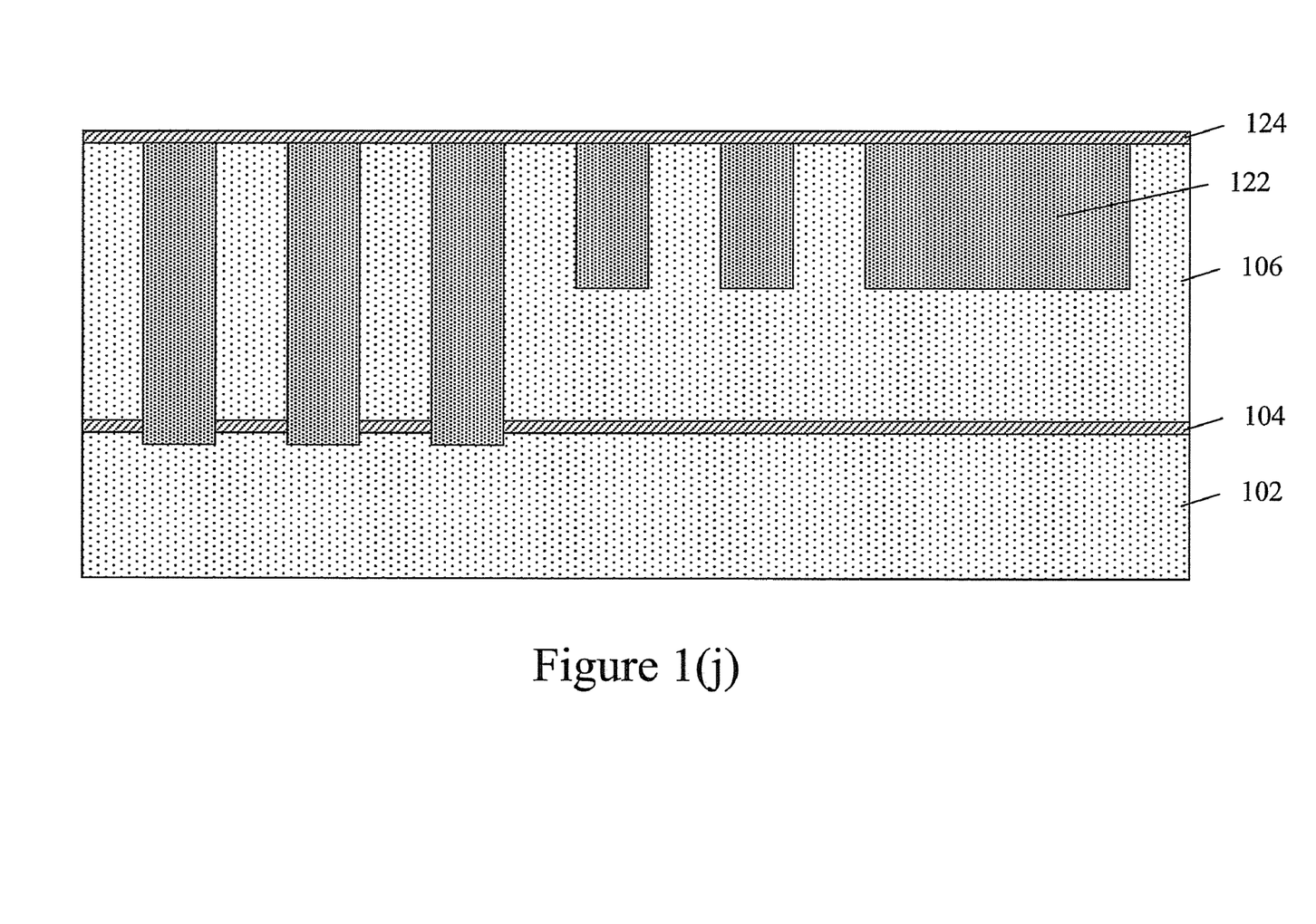

As shown in FIG. 1(h), any remaining portions of the sacrificial etch stop layer 120 are removed as a result of the cap layer etch that extends the vias 110 through the cap layer 104, and facilitating electrical interconnection to the lower level 102. From this point, standard dual damascene processing can continue, including filling the trenches and vias with a liner/metal fill material 122 as shown in FIG. 1(i), planarization to remove the excess metal 122 and the hardmask layer 108, and formation of another cap layer 124 as shown in FIG. 1(j) in the event further wiring layers are to be formed.

In addition to other contemplated embodiments where a self-aligned, sacrificial etch stop layer is used at a substrate level of a semiconductor device, it is also contemplated that prior to stripping the OPL 112, sidewalls of the via or trench layer(s) through may be passivated by halo (angled) carbon implanting. Such an enriched carbon layer is more resistant to OPL stripping and can maintain the sidewall integrity or the vias/trenches prior to metal filling thereof.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device, the method comprising:
    patterning a photoresist layer formed over a homogeneous semiconductor device layer to be etched;
    subjecting the semiconductor device to an implant process that selectively implants a sacrificial etch stop layer that is self-aligned in accordance with locations of features to be etched within the homogeneous semiconductor device layer, and at a desired depth for the features to be etched;
    etching a feature pattern defined by the patterned photoresist layer into the homogenous semiconductor device layer, stopping on the implanted sacrificial etch stop layer;
    removing remaining portions of the implanted sacrificial etch stop layer prior to filling the etched feature pattern with a fill material; and performing a carbon halo implant to protect sidewalls of the etched feature pattern, prior to removal of a sacrificial organic planarizing layer formed in the etched feature pattern.

2. The method of claim 1, wherein the sacrificial etch stop layer comprises a carbon species.

3. The method of claim 1, wherein the homogeneous semiconductor device layer comprises a dielectric layer in a wiring level of the semiconductor device.

4. The method of claim 3, wherein the fill material comprises a metal material used in damascene processing.

5. The method of claim 1, wherein the homogeneous semiconductor device layer comprises a semiconductor layer in an active device region of the semiconductor device.

6. A method of forming a wiring layer for a semiconductor device, the method comprising:
    patterning a photoresist layer formed over a homogeneous dielectric layer to be etched;
    subjecting the semiconductor device to an implant process that selectively implants a sacrificial etch stop layer that is self-aligned in accordance with locations of features to be etched within the dielectric layer, and at a desired depth for the features to be etched;
    etching wiring trenches defined by the patterned photoresist layer into the dielectric layer, stopping on the implanted sacrificial etch stop layer;
    removing remaining portions of the implanted sacrificial etch stop layer prior to filling the wiring trenches with a metal fill material; and
    performing a carbon halo implant to protect sidewalls of the wiring trenches, prior to removal of a sacrificial organic planarizing layer formed in the wiring trenches.

7. The method of claim 6, wherein the sacrificial etch stop layer comprises a carbon species.

8. A method of forming a dual damascene wiring layer for a semiconductor device, the method comprising:
    forming a plurality of vias within a homogeneous dielectric layer;
    filling the vias with an organic planarizing layer, forming a barrier layer over the organic planarizing layer, and forming a photoresist layer over the barrier layer;
    patterning the photoresist layer in accordance with trench features to be etched within the dielectric layer;
    subjecting the semiconductor device to an implant process that selectively implants a sacrificial etch stop layer within the dielectric layer that is self-aligned in accordance with locations of the trench features to be etched within the dielectric layer, and at a desired depth for the trench features to be etched;
    transferring the patterned trench features through a portion of the organic planarizing layer and through a hardmask layer disposed on the dielectric layer;
    etching the patterned trench features transferred to the hardmask defined by the patterned photoresist layer into the dielectric layer, stopping on the implanted sacrificial etch stop layer;
    stripping remaining portions of the organic planarizing layer;
    extending the depth of the vias by completely etching through a cap layer below the dielectric layer, and completely removing remaining portions of the implanted sacrificial etch stop layer prior to filling the vias and trenches with a metal fill material.

9. The method of claim 8, wherein the sacrificial etch stop layer comprises a carbon species.

10. The method of claim 9, further comprising performing a carbon halo implant to protect sidewalls of the vias and trenches.

11. The method of claim 10, wherein the carbon halo implant protects sidewalls of the vias and trenches prior to stripping the organic planarizing layer.

* * * * *